United States Patent [19]

Davies et al.

[11] Patent Number: 4,504,849
[45] Date of Patent: Mar. 12, 1985

[54] SEMICONDUCTOR DEVICES AND A SOLDER FOR USE IN SUCH DEVICES

[75] Inventors: Neil A. Davies, Wednesbury; Edward T. E. Hughes, Stockport, both of England

[73] Assignee: U.S. Philips Corporation, New York, N.Y.

[21] Appl. No.: 398,124

[22] Filed: Jul. 14, 1982

[30] Foreign Application Priority Data

Jul. 31, 1981 [GB] United Kingdom ............... 8123478

[51] Int. Cl.³ ............... H01L 29/48; H01L 29/40; H01L 29/46; H01L 29/62
[52] U.S. Cl. ............... 357/67; 357/65; 357/71; 228/263.18; 420/566
[58] Field of Search ............... 357/65, 67, 4, 71; 420/563, 566; 228/123, 263.12, 263.18

[56] References Cited

U.S. PATENT DOCUMENTS

| | | | |
|---|---|---|---|
| 3,771,211 | 11/1973 | Postupack | 228/263.18 |
| 3,820,152 | 6/1974 | Booth | 357/67 |
| 3,878,442 | 4/1975 | Bhatt | 357/67 |
| 3,913,120 | 10/1975 | Lahiri | 357/4 |
| 3,986,255 | 10/1976 | Mandal | 357/71 |

FOREIGN PATENT DOCUMENTS 55-78536  6/1980  Japan ............... 357/65

OTHER PUBLICATIONS

C. E. T. White et al., "Proforma on Preforms", *Solid State Technology*, (Sep. 1975) pp. 45–48.

*Primary Examiner*—Andrew J. James
*Assistant Examiner*—J. Carroll
*Attorney, Agent, or Firm*—Robert T. Mayer; Steven R. Biren

[57] ABSTRACT

A semiconductor device, for example a power rectifier, formed in a semiconductor body has a contact area coated with a metal layer of, for example, gold. A metallic member is soldered to the layer with an alloy comprising at least 80% lead, the balance being indium and silver in a ratio of at least 4:1 and at most 10:1. One such solder which has good wetting characteristics for improved bond strength contains approximately 92% lead, 7% indium, and 1% silver.

10 Claims, 1 Drawing Figure

SEMICONDUCTOR DEVICES AND A SOLDER FOR USE IN SUCH DEVICES

BACKGROUND OF THE INVENTION

This invention relates to a semiconductor device comprising a semiconductor body having a metallized contact area soldered to a metallic member with a solder which comprises at least 80% lead, the balance of the solder being substantially all indium and silver. The invention also relates to a solder for use in such devices.

The use of a solder for bonding a semiconductor body to a metallic member is common in the semiconductor industry, particularly in the manufacture of non-hermetic power semiconductor devices where it is important that the bond can withstand mechanical and thermal stress as well as corrosion. Thus, the solder itself must be capable of providing a strong bond, as well as having the ability to resist rupture and corrosion due to either environmental influences or fatigue resulting from cyclic thermal stress.

To be more specific, the solder should have good wetting characteristics relative to the surfaces to be joined in order to achieve optimum surface contact for strong bonding.

In the case of power semiconductor rectifiers it is usual for the contact areas of the semiconductor body in which the device is formed to be metallised with a system of two or more different metal layers, the outermost being a thin layer of gold typically 0.45 micrometers thick. Because of their compatibility with silicon and their good wettability, solders consisting of lead and tin have been widely used for bonding metallic contact members to power silicon rectifiers. Unfortunately, however solders containing tin exhibit the phenomenon of gold scavenging. That is to say, the tin tends to dissolve the gold, removing it from the metallized contact areas. Thus the contact areas can become denuded of their gold metallization. Moreover, the gold can react with the tin and form hard intermetallics which cause brittleness of the bond when the solder cools. Having scavenged the gold, the tin can also alloy with the semiconductor material of the rectifier, thus impairing it both electrically and mechanically.

In their article entitled "Proforma on Preforms" which appeared on pages 45 to 48 of the September 1975 issue of Solid State Technology, C. E. T. White and H. C. Sohl mention an alternative solder for use with silicon power rectifiers. This solder, which consists of 92.5% lead, 5% indium and 2.5% silver is said to have a better resistance to thermal cycling than the alloy of lead (95%) and tin (5%). Unfortunately this lead, indium and silver alloy is described as having a poorer wettability than it's lead-tin counterpart.

Nevertheless, the lead-indium-silver alloy has become widely used in the manufacture of power semiconductor devices and slight variants are available from different solder manufacturers. Thus, for example Semi-Alloys Inc. Of Mount Vernon, N.Y., U.S.A., in their 1980 catalog offer alloys with the following ratios of lead, indium and silver respectively, namely 93%, 5%, 2% and 90%, 5%, 5%.

The relatively wide acceptance of these lead-indium-silver alloys reflects the fact that the industry is resigned to accept compromise viz. reduced gold scavenging at the expense of reduced wetting characteristics. Nevertheless, there is a need for a solder which combines high resistance to thermal cycling with improved wetting characteristics.

It is known that the indium and silver constitutents of the alloy go some way to improving the wettability of the solder. On the face of it, therefore, it might be reasonable to conclude that improved wetting would result from increasing the overall content of the indium and silver and conversely, that a reduction in the content of either of these constituents would impair the wetting action of the solder.

SUMMARY OF THE INVENTION

According to a first aspect of the present invention a semiconductor device having the features mentioned above is characterized in that the indium content of the solder is at least four and at most ten times as great as the silver content.

The indium to silver ratio of this solder is at least 4:1. Comparing this to the prior art solders containing lead, indium and silver, the ratio of 4:1 (In:Ag) can be achieved by increasing the indium content, or reducing the silver content or both.

It has been found that a solder in accordance with the invention has improved wetting characteristics while maintaning it's resistance to corrosion and to mechanical and thermal stress.

In fact, analysis by the Applicants of known lead-indium-silver solders has revealed that the bulk of the solder behaves like pure lead and that nodules can exist in the solder and that these nodules can form on the surface of the solder after cooling. Further investigation has revealed not only that these nodules contain indium and silver but that they do so with the same ratio of constituents as in the solder itself. Thus for example, with a solder containing 92% lead, 5% indium, and 2.5% silver, the resulting nodules contain indium and silver only in the ratio of 2:1. Now the melting point of these nodules is approximately 410° C. which should be compared with a melting point of approximately 300° C. for the solder as a whole and approximately 327° C. for pure lead. This has unfortunate consequences because heating the solder to a temperature of say 350° C. which is sufficiently high to melt the bulk of the solder will not melt the nodules. Thus once such nodules are formed they will remain solid under normal soldering conditions. As might be expected the wetting action of the solder is inhibited because the nodules remove indium and silver from the solder which thus behaves more like pure lead.

When the silver content is increased it has been found, in contrast with what at first sight might be expected, that the problem is enhanced. Take for example a solder having a lead, indium and silver content of 90%, 5%, and 5% respectively. This solder has a melting point of between 290° and 310° C. In this case nodules are again seen to be present but now with an indium to silver ratio of 1:1, their melting point being in excess of 525° C. In fact the nodules in this case can better be described as crystallites which protrude through the surface of the bulk of the solder which, as mentioned above, is essentially pure lead. Thus, again the wetting action of the solder is impaired.

The present invention is based on the recognition of the fact that silver and indium tend to separate out from the bulk of the solder as nodules, but that this need not be a problem if the indium-silver ratio is such that the indium-silver alloy will melt at a temperature lower than that to which the solder is normally heated. To melt lead-indiun-silver solders having a lead content of more than 80% it is usual to heat them to temperatures of say approximately 370° C. Now the alloy comprising four times as much indium as silver melts at approximately 340° C. In other words at normal soldering temperatures the indium-silver alloy which might otherwise separate out from the bulk of the solder is molten and so it does not impair the solder's wetting action.

A solder in accordance with the invention may contain at least 5% indium and at most 2% silver. Because the percentage of silver is less than in the known lead-indium-silver solders mentioned above it can be made more cheaply.

Preferably the solder contains seven times as much indium as silver. One such solder, which contains approximately 92% lead, 7% indium, and 1% silver has a melting point in the region of 290° C. to 300° C. The melting point of indium-silver having a ratio of 7:1 is approximately 250° C. and so the whole solder will be molten at normal soldering temperatures of say 370° C.

BRIEF DESCRIPTION OF THE DRAWING

An embodiment of the invention will now be described by way of example with reference to the accompanying drawing, in which the single FIGURE is a cross-sectional view of a semiconductor body having a metallized contact area soldered to a metallic member.

DESCRIPTION OF THE PREFERRED EMBODIMENTS

Figure 1:
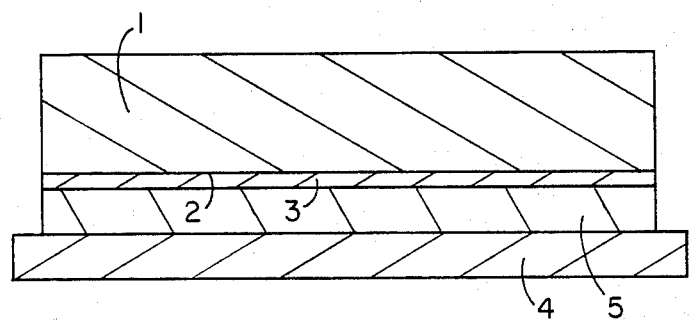

The following description concerns the soldering of a silicon power rectifier to a metallic member using a solder in accordance with the invention. The silicon rectifier, which may be, for example a thyristor, is formed in a silicon body 1. In practice, of course, the silicon body will comprise various layers and regions of different conductivity types depending on the particular type of rectifier. For example a thyristor is essentially a four layer p-n-p-n device, the outermost p-region forming the anode of the device. The structure of thyristors as well as other semiconductor rectifier devices is well-known and consequently no further details will be given here. For the sake of clarity of the FIGURE does not show the different conductivity type layers, instead the semiconductor body 1 in which the rectifier is formed is represented as a simple block.

As shown in the FIGURE, the major surface 2 of the semiconductor body is the contact area of the rectifier. In the case of a thyristor, for example, this would be the anode contact area. The contact area is metallized with a metal layer system 3, which may be for example a three layer system of gold on nickel on chrome, the outermost layer being gold. The gold, nickel and chrome layers can be provided by evaporation in conventional manner and may have a thickness of 0.45 micrometer, 0.25 micrometer, and 0.05 micrometer respectively. For the sake of clarity the FIGURE does not show the individual metal layers, but instead of the layer system 3 is shown as single entity.

The silicon body 1 is bonded to a metallic member 4 by a solder 5. The metallic member 4 may be, for example a plinth made of a material such as molybdenum which has a similar thermal coefficient of expansion to that of silicon. The use of such a plinth, which is common in the manufacture of power rectifiers, protects the silicon body 1 from stresses which might otherwise occur as a result of differential thermal expansion of the components which are soldered together. As is usual, the plinth 5 may itself be in thermal and electrical contact with a base member (not shown).

The following method can be used to solder the semiconductor body 1 to the plinth 5. This method involves the use of a solder preform. Solder preforms themselves are well known to those working in the art of power semiconductor devices. Basically, a preform is a preshaped piece of solder whose shape is tailored to the particular soldering operation to be performed. In the present example the preform may be 100 micrometers thick. The solder preform is made of an alloy containing approximately 92% lead, 7% indium and 1% silver. It should be noted that the percentages specified here are intended to allow for impurities which, in practice, may well be present in the alloy. The melting point of this solder is approximately in the range of 295° C. to 305° C.

Before assembling the components to be soldered, the preform is cleaned for approximately 60 seconds in a bath of Dynabrite (Trade Mark) available from Dynachem International Limited. The preform is then placed on the plinth 5 and the silicon rectifier is placed on the preform with its contact area 2 facing the solder. The contact area 2 of the rectifier has previously been metallized with the metal layer system of gold on nickel on chromium in known manner as mentioned above. The assembly is held secure using conventional jigs before it is introduced into a belt furnace in which the peak temperature is approximately 370° C. The atmosphere in the furnace consists of hydrogen which acts as a flux for the solder. Typically the assembly moves through the furnace so that the solder is held at a temperature above its melting point for about 5 to 7 minutes.

On cooling, the plinth 5 is strongly bonded to the silicon body and, moreover, the soldered joint is highly resistive to corrosion as well as to thermal and mechanical stress.

Having generally described the soldering of a metallic plinth to a metallized contact area of a silicon body, it will now be clear to a person skilled in the art that a solder in accordance with the invention can be used for bonding other metallic members to metallized contact areas of a semiconductor body. Thus, for example, such a solder can be used to bond a copper contact wire to the metallized gate contact area of a thyristor.

It will be appreciated that the embodiment described here is given merely by way of example and that many modifications can be made within the scope of the invention. For example, the contact areas may be metallized with a system of more or less than three different metallic layers. Moreover, the outermost layer may be a metal other than gold, for example, silver.

We claim:

1. A semiconductor device comprising a semiconductor body having a metallized contact area soldered to a metallic member with a solder which comprises at least 80% lead, the balance of the solder being substantially all indium and silver, characterized in that the indiun content of the solder is at least four and at most ten times as great as the silver content.

2. A semiconductor device as claimed in claim 1, characterized in that the solder comprises at least 5% indium and at most 2% silver.

3. A semiconductor device as claimed in claim 1 or 2, characterized in that the indium content of the solder is seven times as great as the silver content.

4. A semiconductor device as claimed in claim 3, characterized in that the solder comprises approximately 92% lead, 7% indium, and 1% silver.

5. A semiconductor device as claimed in claim 1 or 2, characterized in that the contact area is metallized with a system of different metal layers, the outermost layer being gold.

6. A semiconductor device as claimed in claim 1 or 2, characterized in that the semiconductor body comprises mainly silicon.

7. An alloy for use as a solder, comprising at least 80% lead, the balance being substantially all indium and silver, characterized in that the indium content is at least four and at most ten times as great as the silver content.

8. An alloy as claimed in claim 7, characterized in that the indium content is at least 5%, and the silver content is at most 2%.

9. An alloy as claimed in claim 7 or 8, characterized in that the indium content is seven times as great as the silver content.

10. An alloy as claimed in claim 9, characterized in that the lead, indium and silver contents are approximately 92%, 7% and 1% respectively.

* * * * *